United States Patent [19]

Hayashida

[11] Patent Number: 5,394,292
[45] Date of Patent: Feb. 28, 1995

[54] ELECTRONIC CAR BUMPER

[75] Inventor: Tatekazu Hayashida, Kanagawa, Japan

[73] Assignee: Tsuden Kabushiki Kaisha, Kanagawa, Japan

[21] Appl. No.: 872,909

[22] Filed: Apr. 23, 1992

[30] Foreign Application Priority Data

Apr. 30, 1991 [JP] Japan .................... 3-126858
Jun. 20, 1991 [JP] Japan .................... 3-176170

[51] Int. Cl.⁶ ............................................ B60K 28/10
[52] U.S. Cl. ............................ 361/179; 180/274;
                                         340/435; 340/904
[58] Field of Search .................... 361/179–181;
       307/10.1; 180/271, 274, 275, 277; 340/904, 436,
                                      437, 903, 905, 435, 433

[56] References Cited

U.S. PATENT DOCUMENTS

| 3,366,925 | 1/1968 | Aubert et al. | 340/903 |
| 4,208,695 | 6/1980 | Noda et al. | 361/181 |
| 4,348,652 | 9/1982 | Barnes et al. | 340/904 |
| 4,349,858 | 9/1982 | Torenius et al. | 361/181 |
| 4,467,313 | 8/1984 | Yoshino et al. | 340/904 |
| 4,661,797 | 4/1987 | Schmall | 340/825.06 |
| 4,728,932 | 3/1988 | Atherton | 361/181 |
| 4,887,066 | 12/1989 | Marek | 340/436 |

FOREIGN PATENT DOCUMENTS 2044790 3/1972 Germany .
60-186773 9/1985 Japan .
2-26414 6/1990 Japan .

OTHER PUBLICATIONS

Abstract of "Obstacle Detection Sensor", Japanese Laid-Open Patent No. 60-186773, Hayashida.

Primary Examiner—A. D. Pellinen
Assistant Examiner—Richard T. Elms
Attorney, Agent, or Firm—Wenderoth, Lind & Ponack

[57] ABSTRACT

A plurality of sensitive high-frequency proximity switches are provided in the bumper of a car and obstacles can be accurately identified. The electronic car bumper includes: a plurality of sensor portions each having sensor plates, first loading coils, and a divided capacitor, and a reference resonance circuit having a reference capacitor, a second loading coil and a divided capacitor. An oscillator drives each of the sensor portions and the reference resonance circuit through switching devices, and a detector detects an output of the oscillator. A discrimination portion discriminates an output of the detector and provides a discriminated signal to an output portion corresponding to the sensors and the reference resonance circuit. A synchronous device switches the switching device and the discriminator portion in synchronization. A direct current amplifier has an output which is adjusted to a point at zero as a reference voltage for the output corresponding to the reference resonance circuit, and a comparator is adjusted to a threshold reference according to the reference voltage.

14 Claims, 18 Drawing Sheets

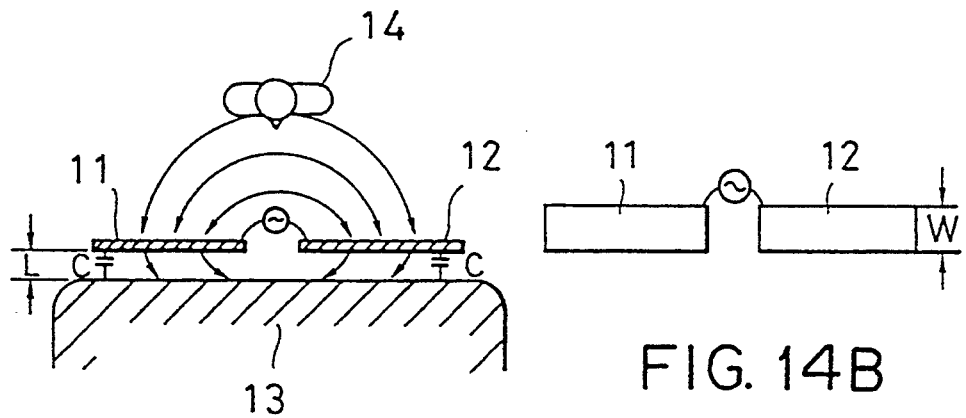
FIG. 14A
FIG. 14B
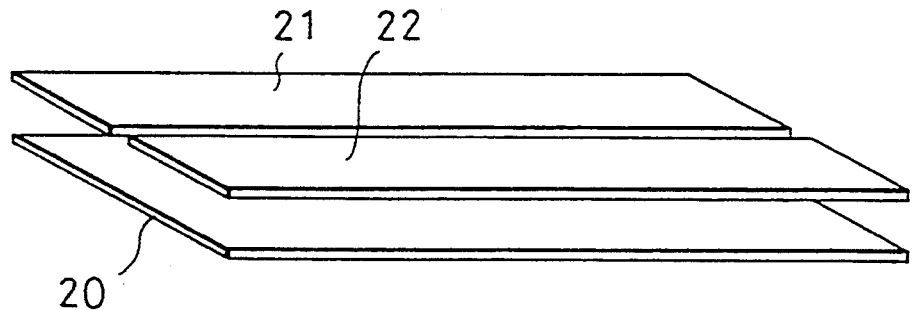
FIG. 15
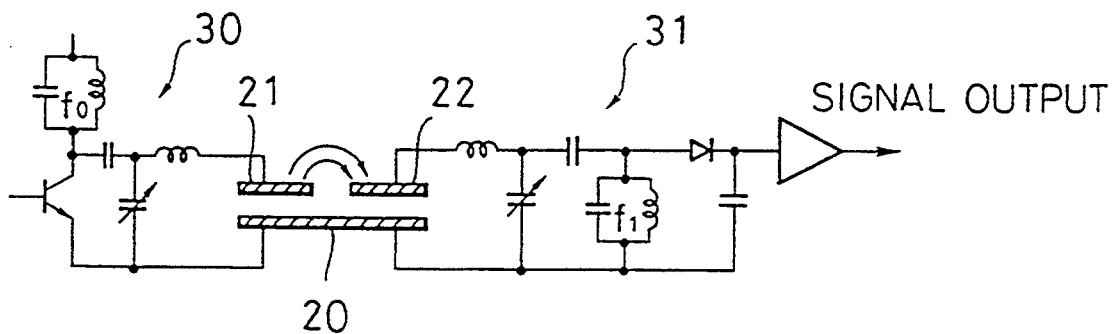
FIG. 16

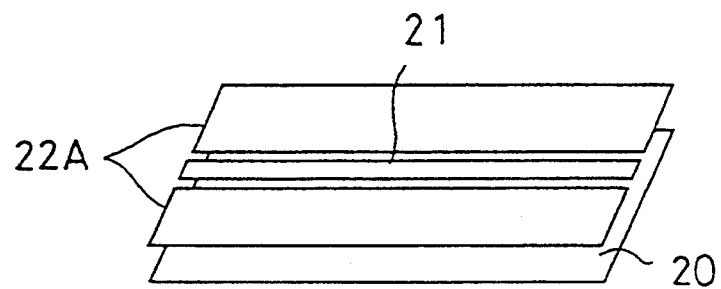
FIG. 20
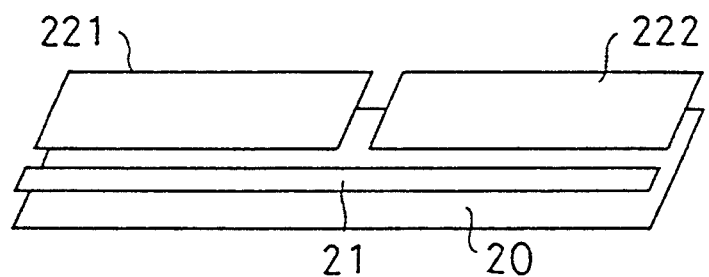
FIG. 21
FIG. 22A
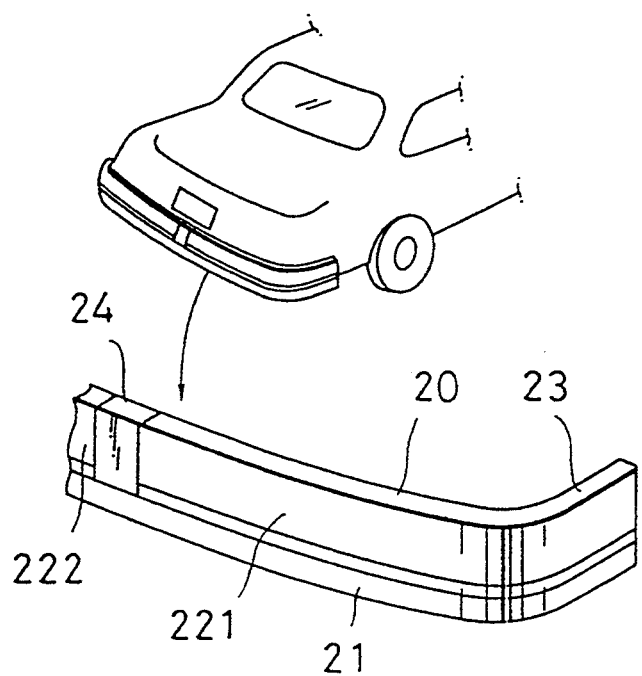
FIG. 22B

FIG. 33A GROUND SURFACE SHAPE
FIG. 33B OUTPUT OF ADA1
FIG. 33C OUTPUT OF ADA2
FIG. 33D RP

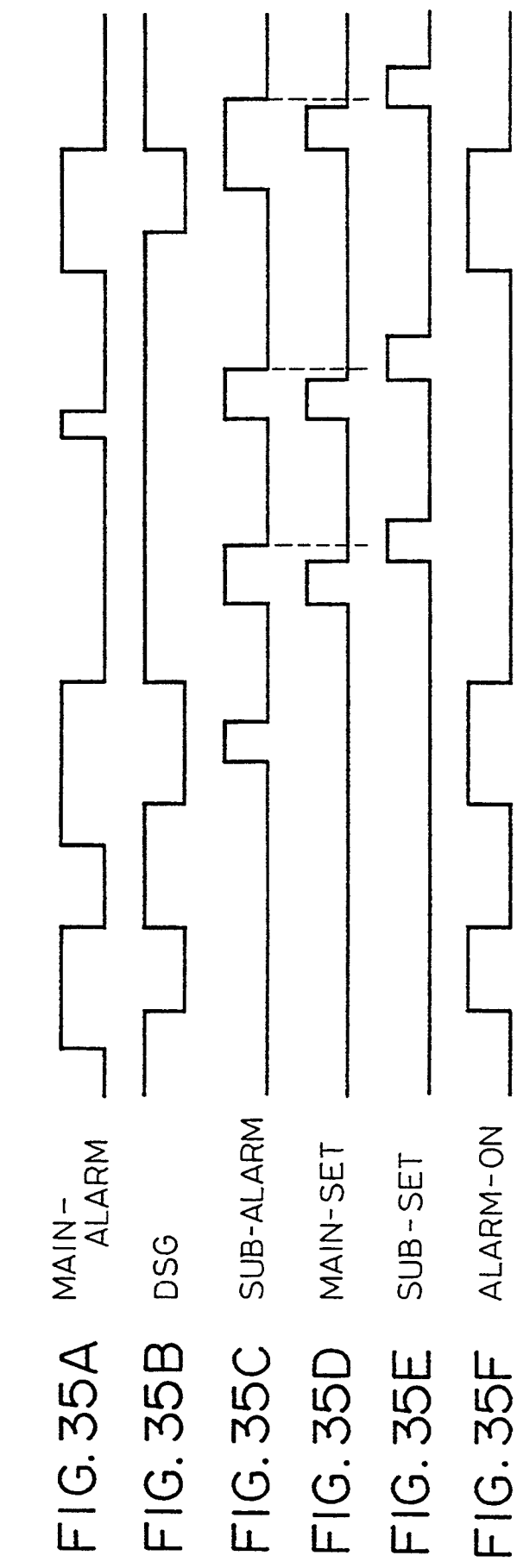

ELECTRONIC CAR BUMPER

BACKGROUND OF THE INVENTION

1. Field of the Invention

The present invention relates to an electronic car bumper in which the bumper, by employing a high-frequency proximity switch, can stably and surely detect an object such as a human body approaching a car and give an indication or a warning.

2. Description of the Related Art

Bumper system such as supersonic system or photoelectric reflection system, which can detect an object approaching a car, are now on the market. As shown in FIG. 1, such systems are installed on or in a bumper 1 in such a manner that they emit supersonic waves or light rays 3, reflected waves of which can be sensed by a sensor 2. Each of these systems, equipped at the corner of the car, have a small range of sensitivity so that they can cover the rear or the entire front part of the car. It is not desirable for the range of sensitivity of the car to vary widely or to spoil the beauty of the car by drilling holes for installing the sensors. The systems have advantages in that a relatively long detecting distance can be obtained and sensor portions (right and left) can be found since they are provided at the corners of the car, while a sensitivity distance of 2–3 [m] is not required for a use of this type. It is more important to have a uniform range of the sensitivity.

Therefore, it has been proposed to apply a high-frequency proximity switch as described in Japanese Patent Laid-open (KOKAI) No.186773/1985. The principles of the proximity switch are as follows: One portion of a high-frequency resonance circuit provided with a capacitor having parallel plate electrodes. One electrode thereof is grounded and the other electrode serves as a sensor plate. When an object such as a human body approaches the latter electrode, the capacitance of tile capacitor is increased. This influences an oscillation condition and makes an output of the oscillation vary. Then, the output is detected and switched.

As described above, an obstacle can be detected by applying the high-frequency proximity switch, but a position of the obstacle cannot be detected. To detect the obstacle, two or three high-frequency proximity switches are needed for one bumper, which results in increased and complicated wirings depending on the number of the proximity switches. If the various circuit systems having different frequencies simultaneously oscillate at close range, the systems interfere with each other and a malfunction occurs, and adjustment of the systems is required by providing with a tank circuit. The capacitance of a bumper varies due to exposure to the direct sun and due to wetness of rainwater or snow. In this case, a range of a temperature drift of a detected output is larger than that of a detected signal, so that a malfunction may occur.

It has been proposed that a high-frequency proximity switch be provided in a car bumper which can detect a man or an obstacle or the like and gives a warning sound as described in Japanese Patent Publication (KOKOKU) No.26414/1990. As shown in FIG. 2, the principle of the car bumper is as follows: The electronic car bumper comprises an oscillation circuit 4, sensor plates 8 including a plurality of electrode plates 6 and 7, a resonance circuit 9 including a loading coil $L_2$ and a divided capacitor $C_3$. A resonance frequency $f_{01}$ the resonance circuit 9 is made equal to a resonance frequency $f_0$ of the oscillation circuit 4. If a human body or the like approaches the sensor plates 8, floating capacitance Cc is increased and the resonanace frequencies $f_0$ and $f_{01}$ are detuned so that an oscillation output is decreased and an approach by a human body or the like can be detected by way of a change of this signal output.

FIG. 3 shows the capacitance which is produced when a person 10 approaches a car 19 equipped with such an electronic car bumper. Capacitance $C_T$ between the person 10 and the electrode 6, capacitance $C_{0T}$ between the person 10 and the car body, and capacitance $C_E$ between the car body and a ground are added to the capacitance of the sensor plates 6 and 7 and an oscillator reacts so that an object or the like is detected. If the person 10 approaches the car 19 while the car 19 is parked, nothing will happen. However, if the person 10 approaches the car 19 while the car 19 is in motion, some malfunction may occur. FIG. 4 shows this relationship.

That is, an electric line of force (a high-frequency current) E radiated from the electrode 6 generates two electric fields. One is an electric field $E_0$ flowing through the capacitance $C_0$ occurring between the car body and the electrode 6. The other is the electric field $E_E$ flowing through capacitance $C_{E1}$ between the ground and the electrode 6. The electric field $E_E$ flows through capacitance $C_{E0}$ generated between the ground and the car body to the electrode 7. If the car 19 is operated in such a condition, the capacitance $C_{E0}$ between the car body and the ground and the capacitance $C_{E1}$ between the electrode 6 and the ground oscillate. This means that the distance (capacitance) between the electrodes 6 and 7 varies generating capacity modulation. Therefore, when the sensitivity of the car bumper is increased, a malfunction may occur.

SUMMARY OF THE INVENTION

The present invention has been achieved in consideration of the above-described situations. An object of the present invention is to provide an electronic car bumper in which the bumper can widely detect objects such as a pillar or a human body without malfunctioning.

The second object of tile present invention is to provide an electronic car bumper employing a high-frequency proximity switch in which the bumper can detect an object approaching a car, even while the car is running without malfunctioning.

Further, the another object of the present invention is to provide an electronic car bumper utilizing a high-frequency proximity switch that is free from the influence of the ground surface and capable of increasing sensitivity even with cars having low bumper mounting positions.

According to one aspect of the present invention, for achieving the objects described above, there is provided an electronic car bumper comprising: a plurality of sensor portions, provided in a car bumper, including sensor plates, first loading coils, and a divided capacitor; a reference resonance circuit including a reference capacitor, a second loading coil and a divided capacitor; an oscillating portion driving each of said sensor portions and said reference resonance circuit through switching means; a detector portion for detecting an output of said oscillating portion; a discrimination portion for discriminating an output of said detector portion, and providing the discriminated signal to an output portion corresponding to said sensor portion and said reference resonance circuit; a synchronous means for switching said switching means and said discriminator portion in synchronization; a direct current amplifier in which an output of the amplifier is adjusted to a point at zero as a reference voltage for the output corresponding to said reference resonance circuit; and a comparator in which an output signal is adjusted to a reference of binarization due to said reference voltage.

According to another aspect of the present invention, there is provided an electronic car bumper employing a high-frequency proximity switch including sensor plates comprising two parallel-plate electrodes which are mounted in a bumper of a car, which comprises separated electrodes facing an object to be detected, each of the separated electrodes are connected to an oscillation circuit and a tuning circuit respectively; a means for detecting a high-frequency output generated from said tuning circuit due to a high-frequency current flowing said oscillation circuit; and a means for detecting an obstacle by means of a change of the high-frequency output.

Further, according to still another aspect of the present invention, there is provided an electronic car bumper employing a high-frequency proximity switch, which comprises a main sensor portion having sensing plates composed of parallel electrodes disposed for opposing a possible object of sensing and a sub-sensor portion having sensing plates composed of parallel electrodes directed either vertically downward or obliquely downward, and said main sensor portion and said sub-sensor portion being arranged in such a manner that a part of the ground surface within a sensitivity distribution range of said main sensor portion will also be included within a sensitivity distribution range of said sub-sensor portion so as to remove, from a detection signal obtained from an oscillation output of said main sensor portion, noise caused by unevenness of the ground surface and obtained from the oscillation output of said sub-sensor portion.

The nature, principle and utility of the invention will become more apparent from the following detailed description when read in conjunction with the accompanying drawings.

BRIEF DESCRIPTION OF THE DRAWINGS

In the accompanying drawings:

FIG. 14 is a view showing an example of an arrangement of sensor plate electrodes capable of being applied to the present invention;

FIG. 15 is a view show the a constitution of sensor plates of the present invention;

FIG. 16 is a circuit diagram showing a principal portion of the present invention;

FIG. 20 is a view showing another example of a constitution of the sensor plates of the present invention;

FIG. 21 is a view showing a construction of sensor plates for detecting a plurality of objects;

FIG. 22 is a view showing an embodiment of an electronic car bumper of the present invention;

FIGS. 33A to 33D are time charts showing the operation of the circuit shown in FIG. 32;

FIGS. 35A to 35F are time charts showing the operation of the circuit shown in FIG. 34.

DESCRIPTION OF THE PREFERRED EMBODIMENTS

Figure 5:
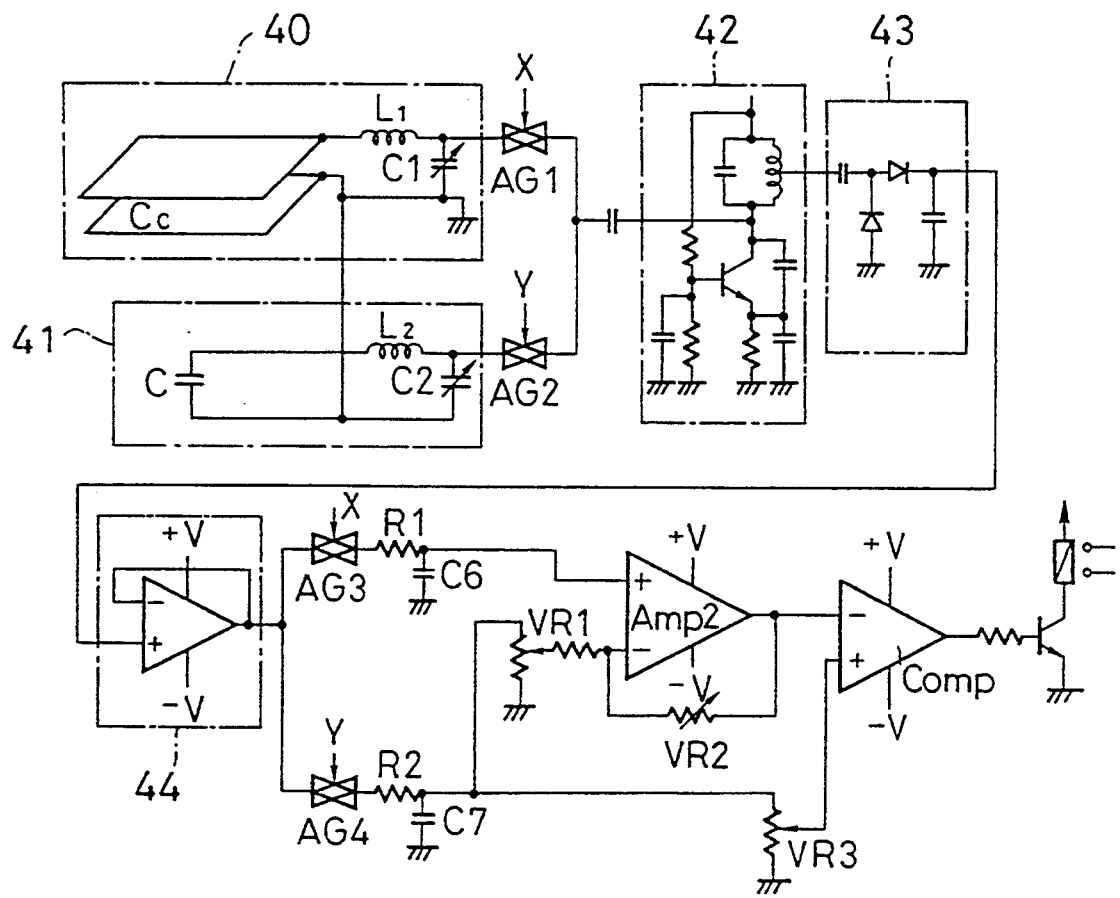
FIG. 5 is a circuit diagram showing an example of the present invention.

Referring now to a circuit diagram shown in FIG. 5, the operation thereof will be described. In FIG. 5, a sensor portion 40 represents a plurality of sensor portions. The sensor portion 40 and a reference resonance circuit 41 are connected sequentially to an oscillator 42 through analog switches AG1 and AG2 respectively controlled by clock pulses X and Y. Outputs of the oscillator 42 to a sensor plate capacitor Cc or a reference capacitor C are made almost equal to each other by adjusting variable capacitors C1 and C2 the sensor portion 40. A detected output detected by a detector 43 through a high impedance voltage follower 44 is discriminated as the detected output corresponding to each sensor represented by the sensor portion 40 and the reference resonance circuit 41 by means of analog switches AG3 and AG4 respectively synchronized with analog switches AG1 and AG2. The detected outputs from the analog switches AG3 and AG4 are respectively smoothed by a filter R1 and C6, or a filter R2 and C7.

Then, the detected output corresponding to each sensor represented by the sensor portion 40 is input to a positive input portion of a direct current amplifier Amp2, while the detected output corresponding to the reference resonance circuit 41 is input to a negative input portion of the direct current amplifier Amp2, whereby these outputs are adjusted as reference voltages to a point at zero by a variable resistor VR1 so as to compensate a change of an output due to temperature or the like. An amplified output signal from the amplifier Amp2 is binarized by a comparator Comp and the threshold value is adjusted by a variable resistor VR3. A gain of the direct current amplifier Amp2 is adjusted by a variable resistor VR2.

Figure 6:
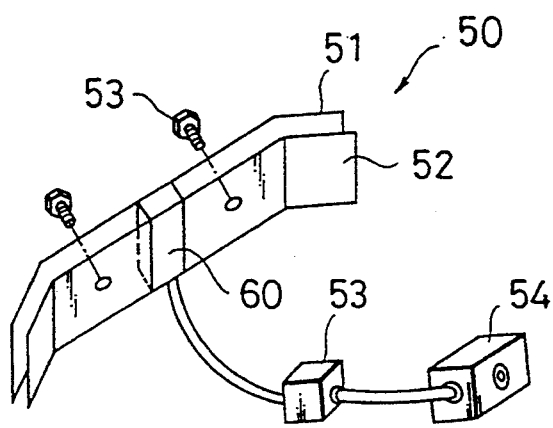
FIG. 6 is a conceptional view showing an entire constitution of the present invention.
Figure 7:
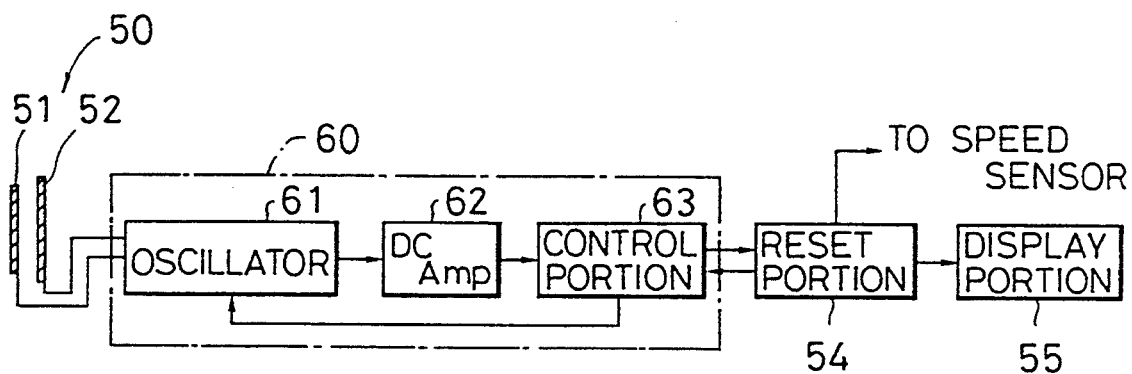
FIG. 7 is a block diagram showing an example of the present invention.
Figure 8:
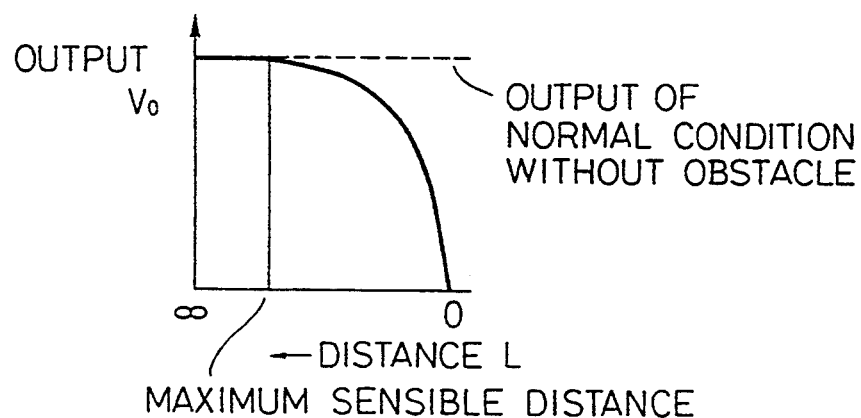
FIG. 8 is a view showing a relation of a distance from an object to an output signal.

FIG. 6 is a conceptional view showing the entire constitution of the present invention, and FIG. 7 is a block diagram of the constitution shown in FIG. 8. An electronic bumper comprises a sensor portion 50, a detector portion 60, a reset portion 54 and a display portion 55. The sensor portion 50 has a function of a capacitor through two parallel plates 51 and 52, and plural sensor portions are provided in a resinous bumper and are respectively fastened to a chassis of a car with bolts 53. Two of the sensor portion 50 are provided in the front part of the car and one or two of them are provided in the rear part of the car. The detector portion 60 comprises an oscillator 61, a direct current amplifier 62 and a control portion 63. A detected output from the oscillator 61 is amplified while it is being compensated in the direct current amplifier 62, the amplified output being applied in the control portion 63. The control portion 63 compares the output with a reference value adjusted by a reference voltage corresponding to a reference resonance circuit, whereby a binarized signal is input to the display portion 55 through the reset portion 54. The reset portion 54 inputs a contact signal to the display portion 55 and sets a circuit system when a speed of a car attains a predetermined speed. The display portion 55 is provided in a dashboard of the car and elves a warning by means of an indicator light or an alarm sound.

Figure 9:
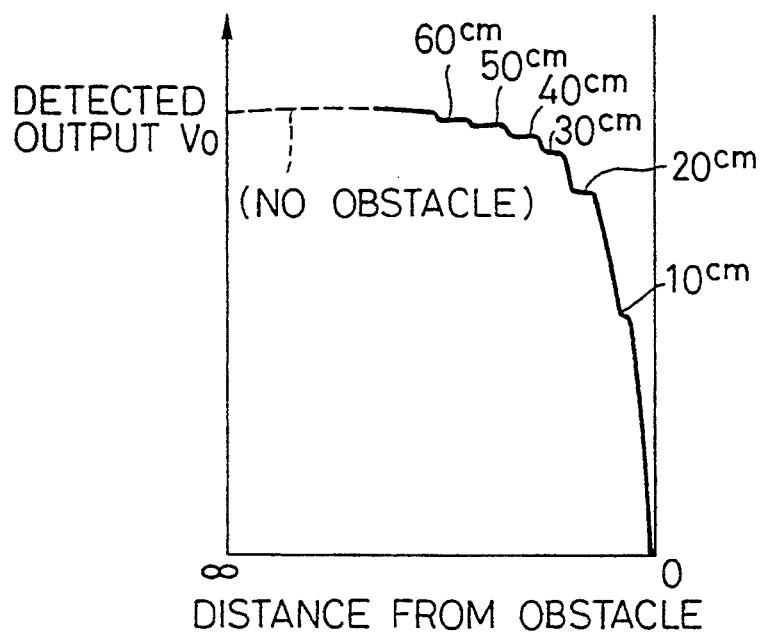
FIG. 9 is a view of surveyed data showing a relation of FIG. 8.

When the electronic car bumper is used in accordance with the above-described constitution, a relationship between a distance L from an object and an output signal $V_0$ is like an exponential function as shown in FIG. 8. When the bumper receives a signal that tile car is approaching within a distance of 50 [cm] from the object, the car is made to reverse carefully and stopped at a distance of 10–20 [cm] from the object. Such a distance allows a range of a change in the detected output to be enlarged and the above-described circuit of FIG. 5 to be employed. A feature of the circuit is that it can continue to operate indefinitely. That is, when the car stopping at a distance of 10–20 [cm] from an object is restarted, a warning that an object is approaching the car is given. FIG. 9 shows an actual data indicating the above relationship. Further, a positional relation between the car and the object approaching the car can be represented by the length of the intervals between the warning sounds.

Next, a modification of the present invention will be described. For example, when the two sensor portions are respectively provided in both the front and the rear parts of the car and a feeder is applied between an oscillator and these sensor portions, some trouble may occur in the car. Therefore, if an oscillator is provided in each of the sensor portions, an electronic car bumper can be formed according to the above-described principle.

Figure 10:
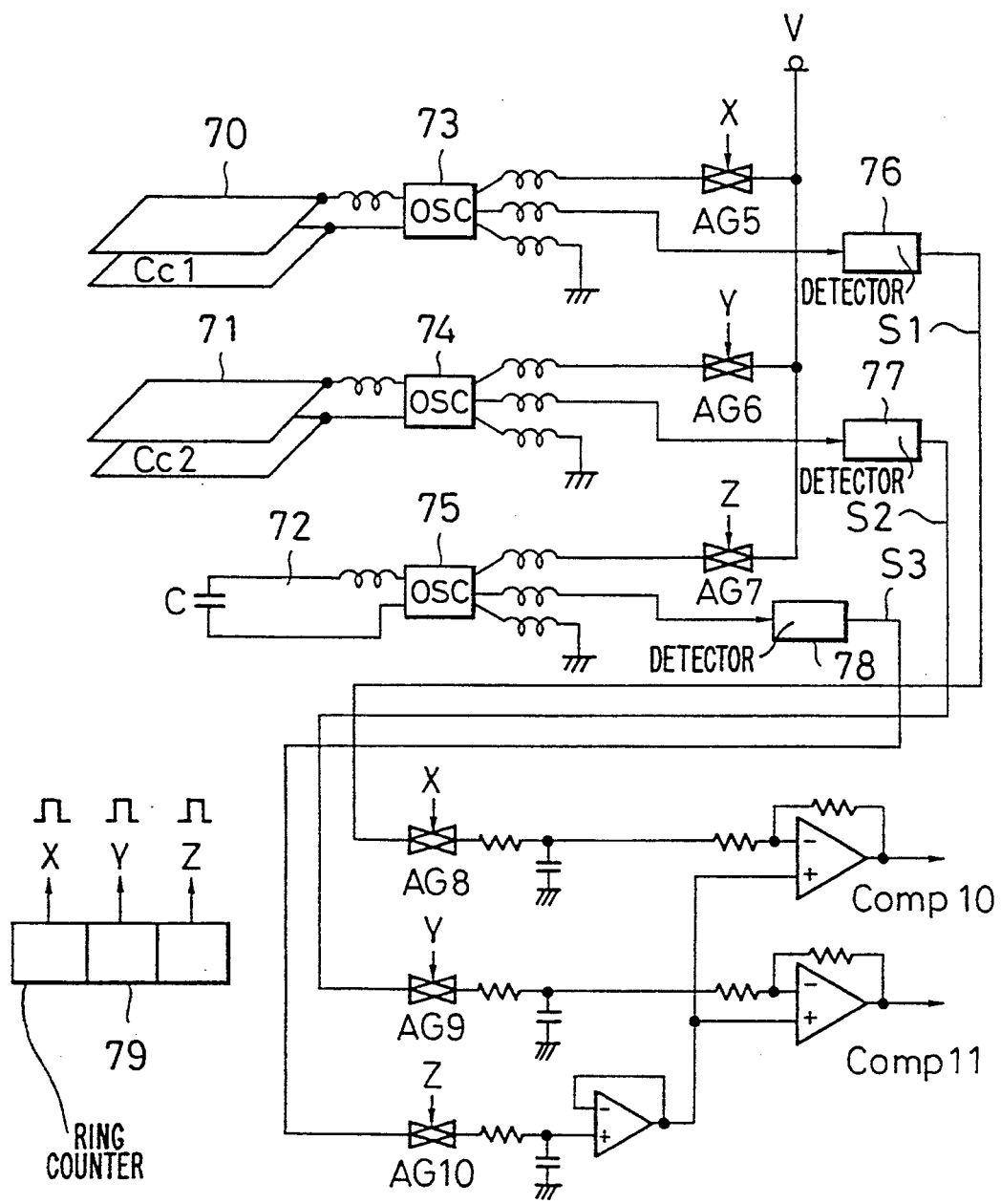
FIG. 10 is a circuit diagram showing another example of the present invention.

FIG. 10 shows a circuit diagram of such a modification. Two sensor portions 70 and 71 are shown in FIG. 10. The sensor portions 70, 71 and a reference resonance circuit 72, respectively provided with oscillators 73, 74 and 75, and are connected to a power supply V through analog switches AG5, AG6 and AG7 respectively controlled by the clock pulses X, Y and Z generated from a ring counter 79. Output signals S1, S2 and S3 detected by detectors 76 to 78 corresponding to the sensor portions 70, 71 and the resonance circuit 72 are respectively gated through analog switches AG8, AG9 and AG10 synchronized with analog switches AG5, AG6 and AG7. The resulting output signals S1 to S3 are respectively smoothed through filters comprising a resistor and a capacitor and represent an object approaching the car by means of the same signal-processing means as the above-described embodiment. In FIG. 10, the direct amplifiers are omitted and only the two comparators Comp10 and Comp11 are shown. In this case, since the oscillators do not simultaneously oscillate, they do not interfere with one another. It is difficult to wire from the oscillators 73 to 75 to the power supply V since a plurality of wirings are needed, but in the present invention, a signal is output after it is detected so that the wiring of the oscillators 73 to 75 to the power supply V is easy to perform. If the same circuit parts as the above-described embodiment are employed for a circuit of an oscillator, the characteristics of the present invention are almost unchanged.

Figure 11:
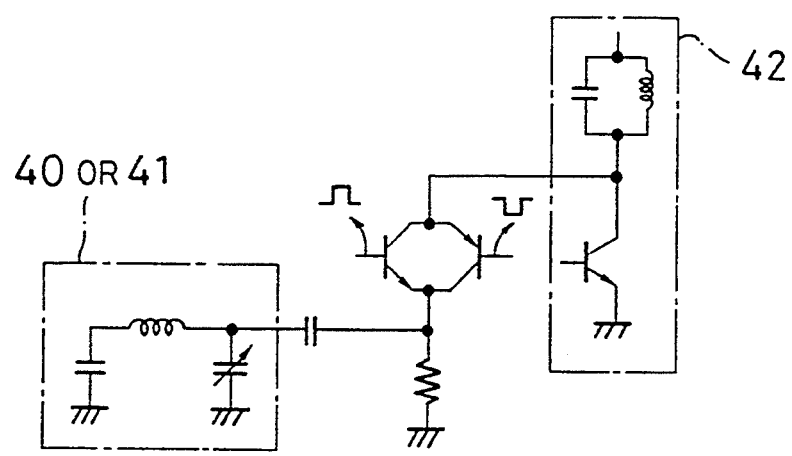
FIG. 11 is a circuit diagram of a switching means using a transistor.

A switching means will now be additionally described. The above-described embodiment shows an example in which the analog switch is used for a switching means which connects the sensor portions and the reference resonance circuit to the oscillator. In this case, for example, when a circuit is ON, a CMOS type analog switch has a resistance of 100 to 500 [Ω], where a little attenuation occurs. If a transistor is used as a switching means, it is justifiable for a small signal of a high-frequency signal to be employed. In case of a large signal, the signal can be passed in such a manner that a PNP transistor and an NPN transistor are reversely connected as shown in FIG. 11, pulses enter into a negative and a positive phases, and they are made to be ON at the same time. However, even in this case, a resistance occurs.

Figure 12:
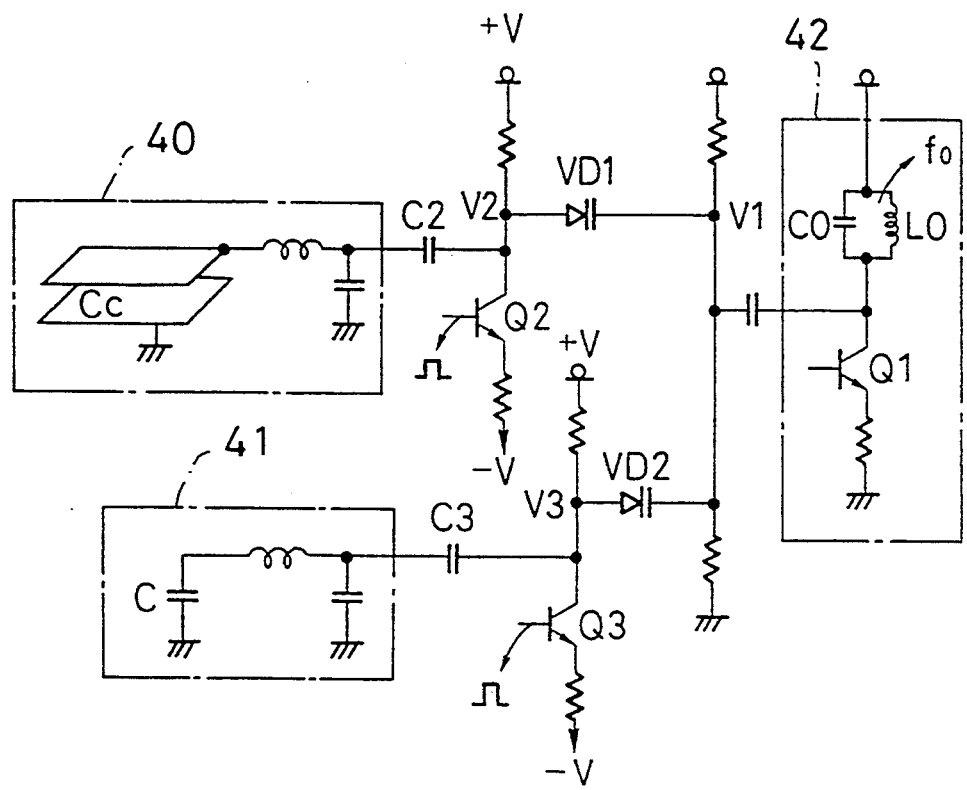
FIG. 12 is a circuit diagram showing another example of a switch means capable of use for the present invention.
Figure 13:
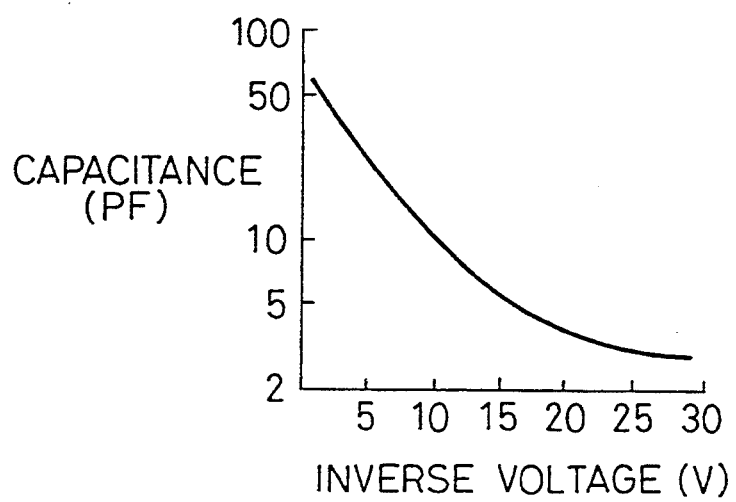
FIG. 13 is a view showing a relation between a variable capacitor and a backward voltage.

As a countermeasure, an excellent result can be obtained by means of the following switching means. FIG. 12 shows a circuit diagram of an oscillating portion using such a switching means. A relation between coupling capacitors C1, C2 and C3 and capacitance CD of variable capacitors VD1 and VD2 is CD<<C1, C2, C3. The circuit is connected when a transistor Q2 or a transistor Q3 is OFF. That is, in the case when V1≧V2, the capacitance CD of the variable capacitors VD1 and VD2 is brought to be large as shown in FIG. 13. Then, if a capacitor CDA1 of VA1 (VA1=V1−V2) is the optimum capacitor as a coupling capacitor, the sensor portion 40 is connected to the oscillating portion 42. On the other hand, since the transistor Q3 is ON, the voltage of (V1−V3) is high, capacitance CDA2 of a variable capacitor VD2 is small, it is grounded by the transistor Q3, and thus it is connected in parallel to a capacitor $C_0$ of a tank circuit having a frequency of $f_0$. It is not affected by a resonance frequency.

As described above, in accordance with an electronic car bumper of the present invention, since a plurality of the high-frequency sensors used are not made to oscillate at the same time, they do not interfere with one another. Further, effects of a temperature or the like are output and compensated at a stabilized reference capacitor and a binarization threshold is adjusted. Thus, a malfunction will not occur.

Figure 3:
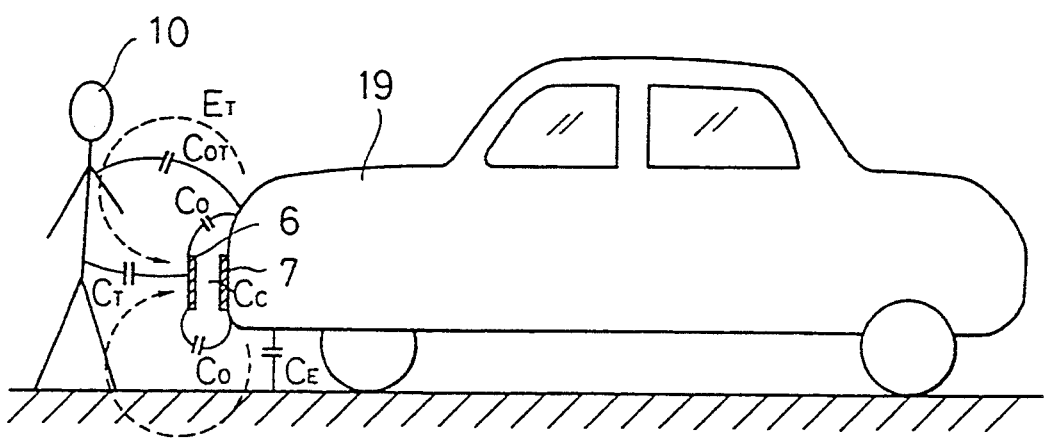
FIG. 3 is a view showing capacitances between an object and a conventional electronic car bumper employing a high-frequency proximity switch.
Figure 4:
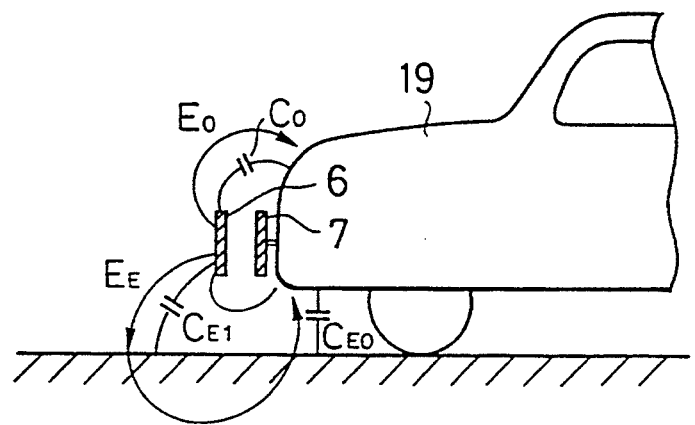
FIG. 4 is a view showing an effect in which a running of a car affects a capacitance for a ground.

To reduce or to remove the above-described malfunction in FIGS. 3 and 4, the influence of the oscillation of the capacitance $C_{E0}$, between the ground and the car body and the capacitance $C_{E1}$, between the electrode 6 and the ground must be decreased. In order to do this, the electrodes 6 and 7 of the sensor plates may be opposed to the object to be detected. FIG. 14 shows an arrangement of the electrodes 11 and 12 are positioned on the same plane. In FIG. 14, an electric field radiated from the electrode 11 enters the electrode 12 through the car body 13 or space. If a person 14 approaches the car body 13 in the above condition, he or she influences the electrode 11 without regard to the ground and the car bumper is operated. That is, if the car is running, it will not be influenced by the ground.

In this case, if a distance L between the electrodes 11 and 12 and the car body 13 is too short, since both the electrodes 11 and 12 are short-circuited each other, a width of the electrodes 11 and 12 need to separate approximately W. For example, the width of electrodes 11 and 12 is 100 [mm], sensitivity (a maximum sensible distance) of 500 to 600 [mm] cannot be obtained without spacing 100 [mm] or more as the distance L. The electrodes 11 and 12 form a state of a dipole antenna and a radiation of an electromagnetic wave has a wide range. If the distance L is wider than 100 [mm], a design of bumper may be limited. It is not a wise course to take. In consideration of the above-described description, according to the present invention, electrodes 20 to 22 facing an object to be detected is made to be an electrode of a tuning circuit as shown in FIG. 15, they connect an oscillation circuit 30 to a tuning circuit 31 as shown in FIG. 16, an oscillation output of the oscillation circuit 30 are provided in the tuning circuit 31, whereby an output of the tuning circuit 31 is detected and an obstacle is detected by a change of the signal output.

That is, the above-described objects have been achieved in accordance with an electronic car bumper employing a high-frequency proximity switch employing two parallel-plate electrodes as sensor plates in such a manner that electrode facing an object to be detected are divided, one electrode is connected to an oscillation circuit, the other electrode is connected to a tuning circuit, a high-frequency output occurring in the tuning circuit by a high-frequency current flowing through the oscillation circuit is detected, and the presence of an obstacle is detected by way of a change of the signal output.

Figure 17:
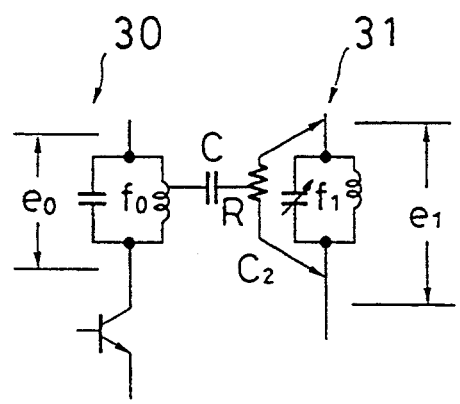
FIG. 17 is an equivalent circuit diagram of the circuit shown in FIG. 16.
Figure 18:
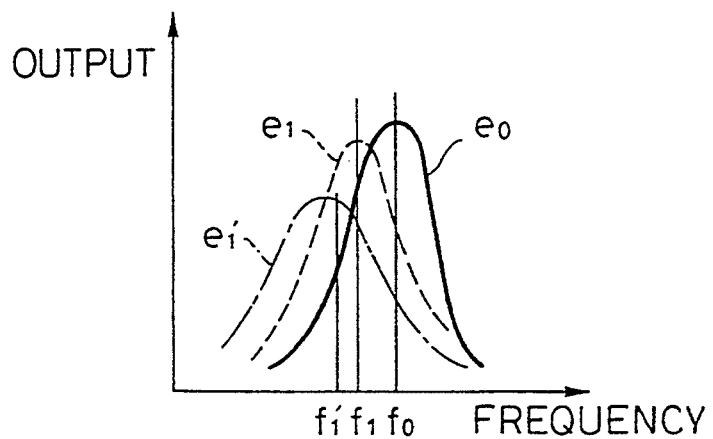
FIG. 18 is a view showing a relation of a frequency and an output of the present invention.
Figure 19:
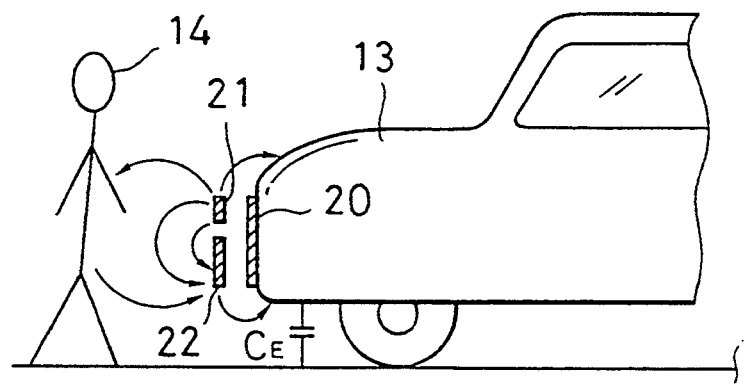
FIG. 19 is a view showing an electric field occurring between a person and sensor plates of the present invention.

Now, if the circuit shown in FIG. 16 is considered by means of an equivalent circuit or the like shown in FIG. 17 and a high-frequency current of frequency $f_0$ from the oscillation circuit 30 is provided in the tuning circuit 31 through a coupling capacitor C and a resonance frequency $f_1$ of the tuning is made equal to the frequency $f_0$ as $f_1 < f_0$, an output of a voltage shown in FIG. 18 can be obtained. At this time, if an object approaches a car and the resonance frequency $f_0$ is made to be $f_1'$ according as capacitance of the coupling capacitor G and a tuning capacitor $C_2$ are increased, a circuit is detuned and an output is reduced to $e_1'$. The object can be detected such a change of sensor plate capacitance and a loss resistance R. As shown in FIG. 19, an electric field in front of the electrodes can be effectively used for detecting an object such as the person 14 in the electric field so that an influence of capacitance $C_E$ toward a ground is reduced.

An embodiment of the sensor plates using the present invention is shown below. As a result of an examination, if an area ratio of an oscillation side electrode 21 and a tuning circuit side electrode 22 is "1:1" and sensitivities of them are the same in comparison with that of electrodes which are not divided, an influence by an oscillation of a capacitance toward the ground during a car running is approximately ½. It is known that if the area ratio is "5:1", the sensor plates are not affected by an oscillation. It is preferable that crystal or the like is practically used for the sensor plates, the oscillation side electrode 21 is made to be small as much as possible, and it is positioned in close vicinity to and parallel to the tuning circuit side electrode 22 in the transverse direction. The oscillation side electrode 21 may be held between the tuning circuit side electrodes 22A as shown in FIG. 20.

As a next embodiment, an example in which a plurality of tuning circuits to detect a position of an object to be detected and a reference circuit having a stabilized reference capacitance for a change of environment to compensate a change of sensor plate capacitance by temperature and environment are placed in juxtaposition will be described.

In a constitution of sensor plates as shown in FIG. 21, if a tuning circuit side electrode 22 is divided into two or more, a tuning circuit is formed on the divided electrodes 221, 222, - - -, and 22N (to describe simply, the number of electrodes are regarded as two in this embodiment), and a detection is performed in each electrode position, a position of an object can be detected. FIG. 22 shows a concrete shape of such sensor plates, the electrodes 20, 21, 221, and 222 made of a thin metal such as aluminuim foil are adhered to the inside and outside of a sheet-type foam resin supporter 23 and they are provided in a bumper with a detector portion 24. However, if a plurality of circuit systems oscillate at close range at the same time, they interfere with each other and a malfunction will occur. Therefore, each electrode 221 or 222 is sequentially connected to the tuning circuit by switching a switch and an output signal is output.

Figure 23:
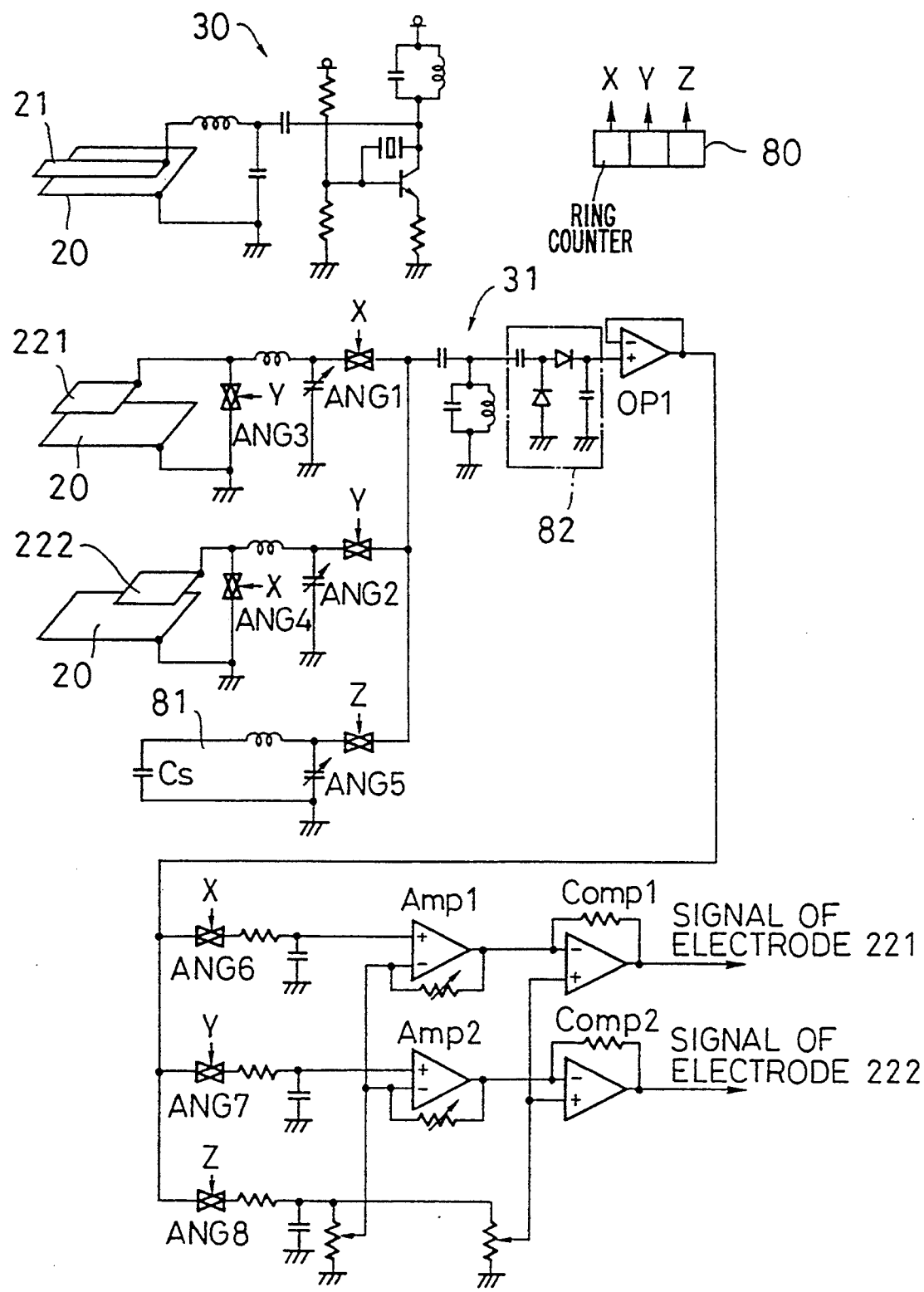
FIG. 23 is a circuit diagram showing an example of detecting a plurality of objects according to the present invention.

FIG. 23 shows the above-described circuit. Both of the sensor plates comprising an electrode 221 or 222 are sequentially connected the tuning circuit 31 through analog switches ANG1 and ANG2 controlled by clock pulses X and Y generated from a ring counter 80. A reference circuit 81 is connected to the tuning circuit 31 through an analog switch ANG5 which is controlled a clock pulse Z from the ring counter 80. A modulating signal obtained from the tuning circuit 31 is detected by a detector 82 and then is discriminated for both the sensor plates 221 and 222 by analog switches ANG6 and ANG7 synchronized with the clock pulses X and Y through a voltage follower OP1. An output of the reference circuit 81 is also input to the tuning circuit 31 through the analog switch ANG5 and then the tuned signal is detected by the detector 82. The detected signal is smoothed through the voltage follower OP1 and an analog switch ANG8 and the smoothed signal is transmitted to direct current amplifiers Amp1 and Amp2 and comparators Comp1 and Comp2 as a respective reference voltages. Outputs from both the sensor plates 221 and 222 are amplified by the direct current amplifiers Amp1 and Amp2 after they are smoothed. The resulting outputs are respectively binarized by the comparators Comp1 and Comp2 and thus the presence of an obstacle with its position can be detected.

A reason that the analog switches ANG3 and ANG4 are used is as follows: For example, if there are no analog switches ANG3 and ANG4 when the electrode 221 is in an active situation, the sensor plates in a high impedance, an obstacle is extremely approached to the electrode 222 (a man directly touches the electrode with a hand), the electrode 222 in an active condition is affected, an output signal is modulated and unadjustable phenomenon occurs, the sensor plate is made to short-circuit by the analog switches ANG3 and ANG4, by which this phenomenon can be removed.

Figure 24:
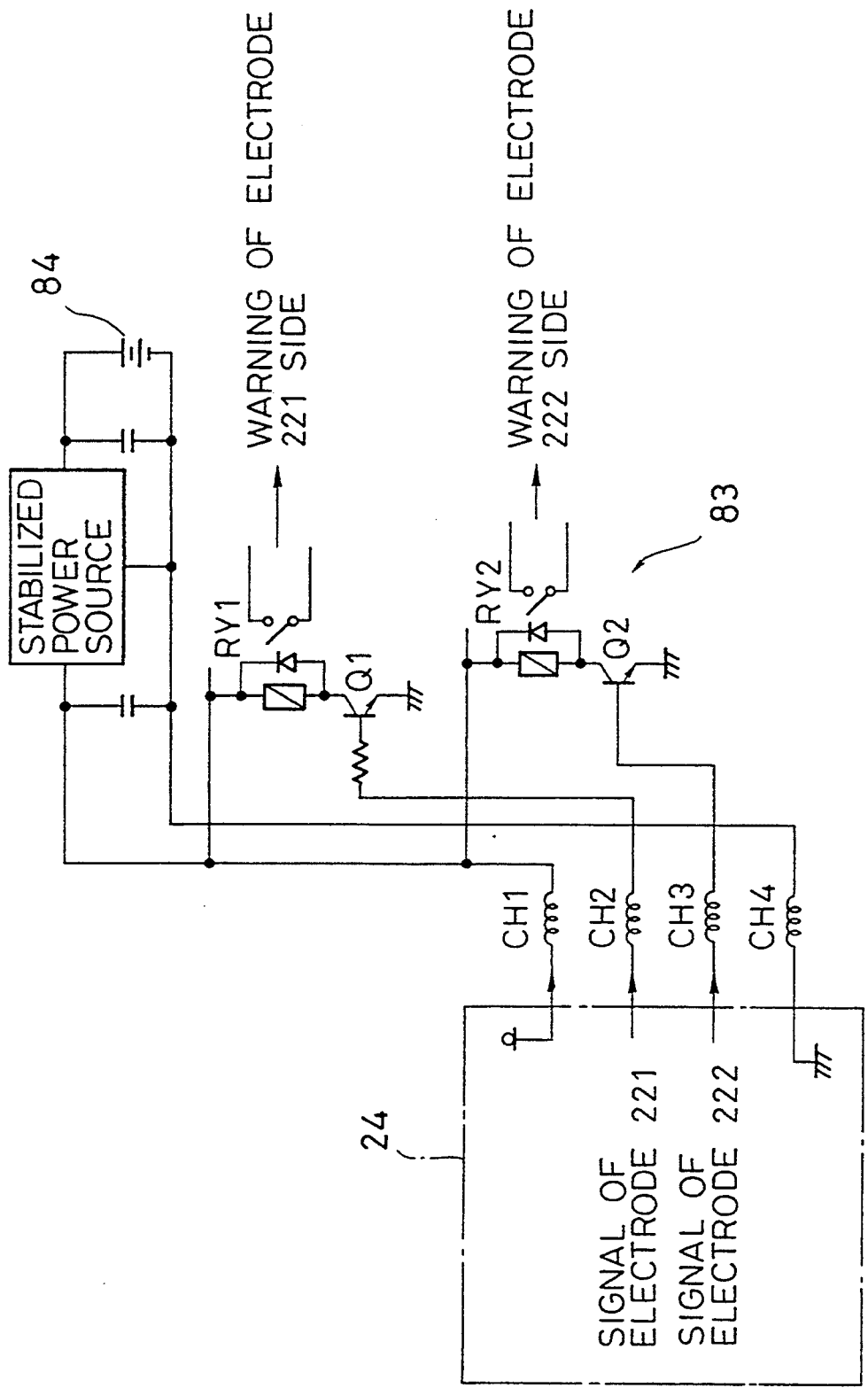
FIG. 24 is a circuit diagram showing a display portion according to the present invention.

Further, in FIG. 23, the reference circuit 81 having a stabilized reference capacitance Cs to a change of an environment such as a temperature is connected to the tuning circuit 31 through the analog switch ANG5 in equivalent to sensor plates comprising the electrodes 221 and 222. An output of the tuning circuit 31 connected to the reference capacitance Cs by the analog switch ANG5 is discriminated and then smoothed, the direct current amplifiers Amp1 and Amp2 are adjusted to a point at zero, whereby a reference of binarization by the comparators Comp1 and Comp2 for respective amplified outputs are adjusted by the reference voltage. Detected output signals operate relays RY1 and RY2 of a display portion 83 provided in a dashboard of a car as shown in FIG. 24 and gives a warning by means of an indicator light or an alarm sound. A chalk coils CH1 to CH4 inserted between the detector portion 83 prevent a malfunction from occurring when the electordes 20, 21, 221 and 222 are mounted on a bumper, if the bumper is made of a metal, there occurs no trouble, but if it is made of resin, it cannot to ground and lines (including signal lines) provided between a power supply 84 and the sensor plates are flowed by a high-frequency current and an electric field is generated.

Figure 25:
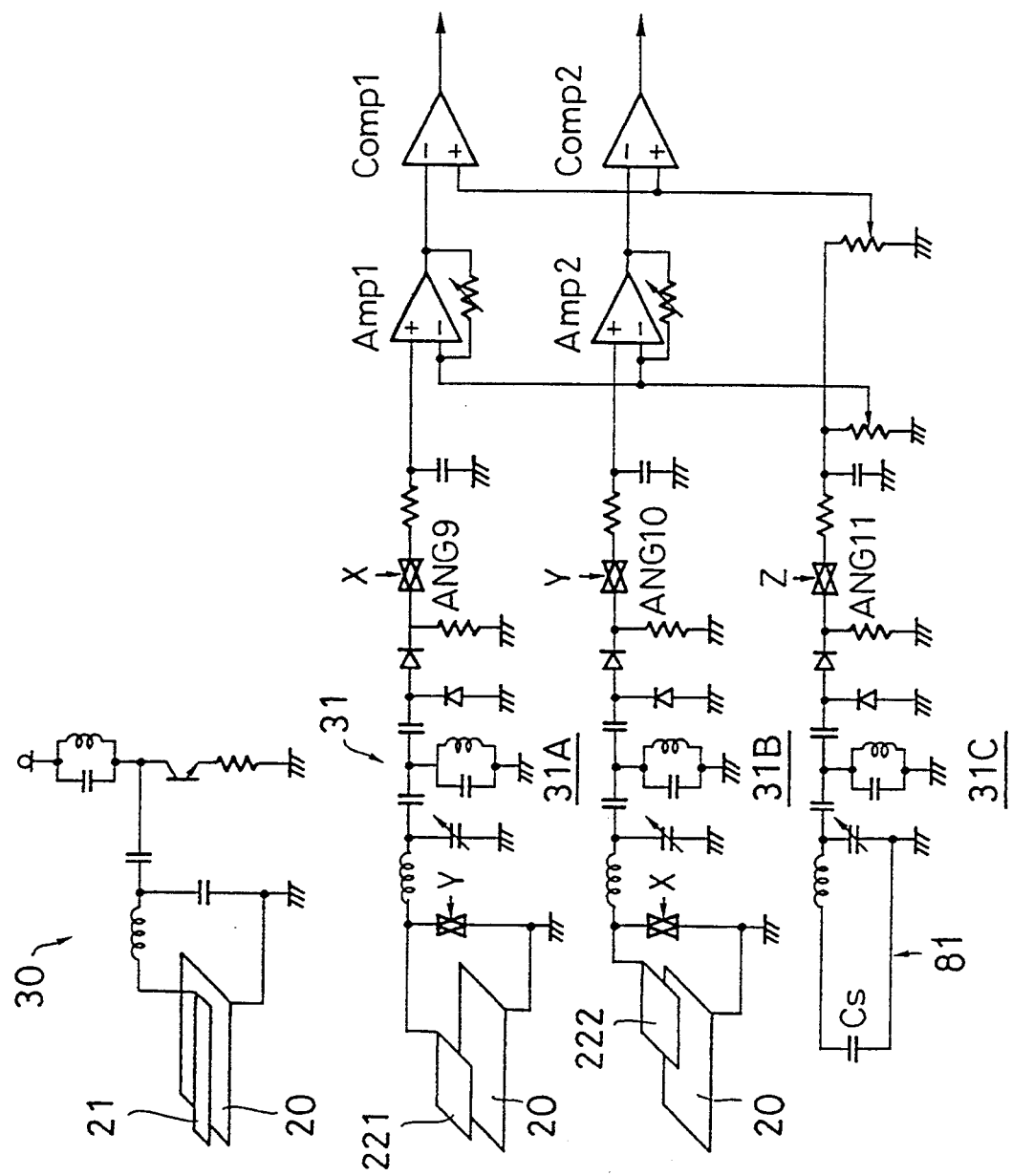
FIG. 25 is a circuit diagram showing another example of detecting a plurality of objects according to the present invention.

Next, a circuit shown in FIG. 25 as a modification of the circuit shown in FIG. 23 can be obtained the same result. In this case, tuning circuits 31 (31A, 31B, 31C) provided in both sensor plates and the reference circuit 81, outputs of them are respectively provided with a time difference and are input to processing circuits of next stage through analog switches ANG9, ANG10 and ANG11.

Figure 26:
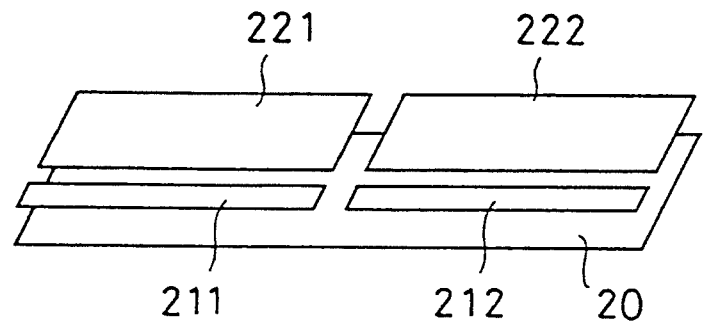
FIG. 26 is a view showing another example of a construction of the sensor plates for detecting a plurality of objects.
Figure 27:
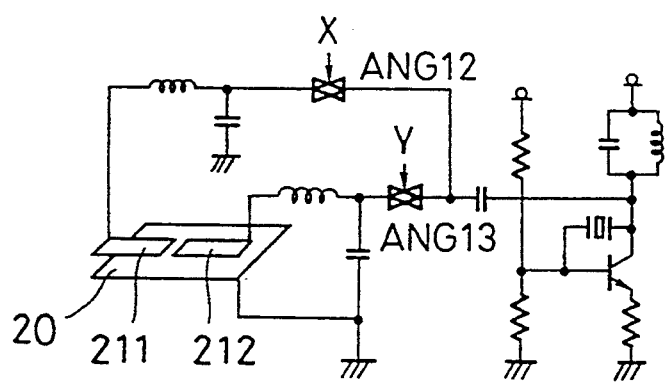
FIG. 27 is an oscillation circuit diagram of the sensor plates for detecting a plurality of objects of FIG. 26.

As described above, the electrode 211 of tuning circuit side can be divided and had a multi-sensitivity, but when an object approaches to the electrode 221 as shown in FIG. 21, an effect of an oscillation appears in the electorde 222, which causes a mulfunction. Therefore, as shown in FIG. 26, if the electode 21 of an oscillation circuit side is also divided to electrodes 211 and 212 and made to correspond to the electrodes 221 and 222, the influence will not occur. In this case, the oscillation circuit 30 shown in FIG. 23 is made to the same as that of FIG. 27. That is, a tuning circuit of the electrodes 221 and 222 side and an oscillation circuit of the electrodes 211 and 212 may be synchronized with each other through the clock pulses X and Y by using analog switches ANG12 and ANG13. Further, an interference between the tuning circuit and the oscillation circuit can be reduced by providing a fixed resistance value without using the analog switches. If this value is selected properly, all the analog switches can be removed in accordance with a sensitivity. Transistor or variable capacitors may be used as the switching means instead of the analog switches.

As described above, in accordance with a constitution of sensor plates of the present invention, an electric field in front of an electrode can be used for detecting an object effectively and capacitance toward a ground while a car is run, which causes a malfunction. Since a plurality of the sensor plates can be positioned at a close range without interfering, the presence of an obstacle and a position can be detected. Further, a change of the sensor plates due to an environment is always made to compensate by using a reference value.

Figure 1A:
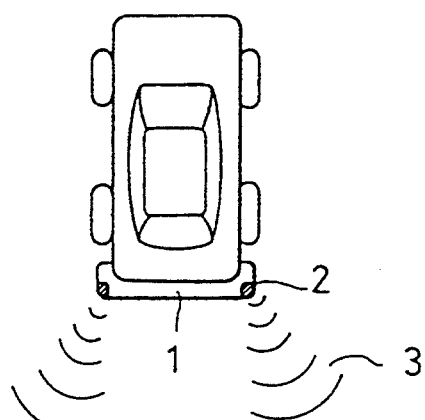
FIG. 1 is a view showing an example of a conventional system of a bumper sensing an obstacle.
Figure 1B:
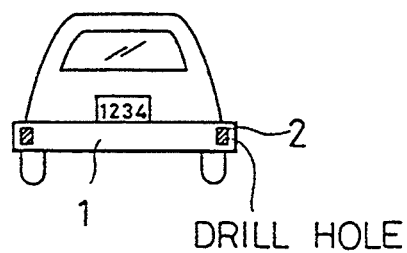
Figure 2:
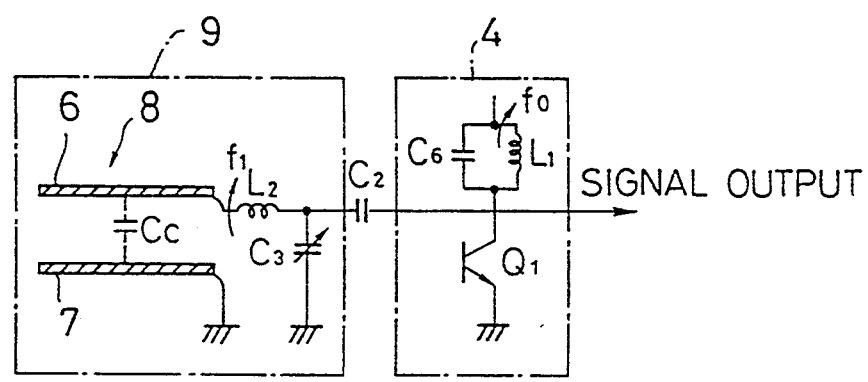
FIG. 2 is a view showing a principle of a conventional high-frequency proximity switch.

In FIGS. 2 to 4 described the prior art in Japanese Patent Laid-open No.186773/1985, a human body or the like is detected as a result of an influence on the oscillator by the addition, to the capacitance $C_c$ of the sensor plates 6 and 7, of the capacitance $C_T$ between the person 10 and the electrode 6 as well as other capacitances such as the capacitance $C_{E1}$ between the electrode 6 and the ground and the capacitance $C_E$ between the car body 9 of the car and the ground. If the ground surface is not even, therefore, such detection involves the risk of tile malfunction due to fluctuations in the electrostatic capacitance when the car approaches an obstacle. In order to avoid this problem, the above invention has been proposed. The proposal is schematically shown in FIG. 16. Referring to the drawing, the electrode that is disposed for facing a possible object to be detected is divided into two electrodes 21 and 22, the electrode 21 being connected to the oscillation circuit 30, the other electrode 22 being connected to the tuning circuit 31. With this arrangement, the electric field in front of the sensor plates is effectively used in detection, thereby reducing the influence by the capacitance with respect to the ground.

Figure 28:
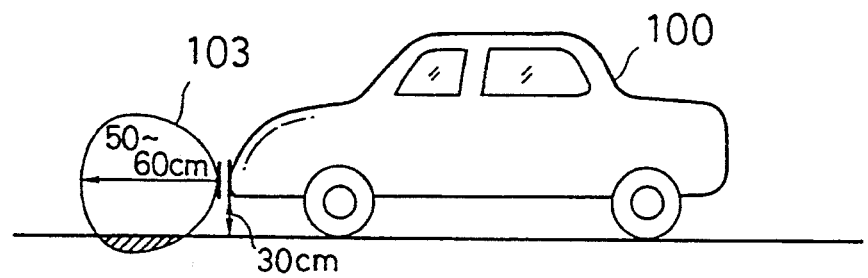
FIG. 28 is a diagram showing the sensitivity distribution of parallel-electrode sensor plates for the car.
Figure 29:
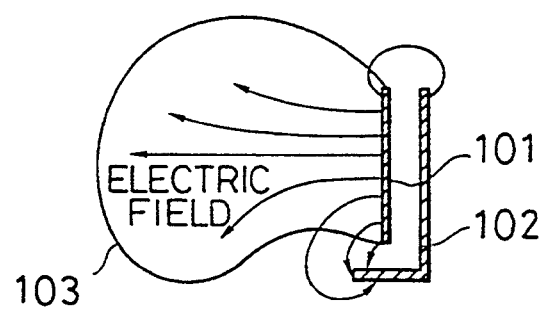
FIG. 29 is a diagram showing an example of an improvement of a sensitivity distribution characteristic.

However, if the position at which the car bumper is mounted is low (for instance, 30 [cm] from the ground surface) as shown in FIG. 28, as in the case of, in particular, a car 100, when the sensitivity is increased so that a distance of 50 to 60 [cm] is covered, the resultant sensitivity distribution range 103 reaches the ground surface, which surface will inevitably be detected. A problem arises, therefore, in that the sensitivity cannot be increased too much. In order to avoid this problem, it is possible to impart an orientation to the sensitivity distribution. Specifically, as shown in FIG. 29, the sensitivity distribution characteristic can be improved by disposing the ground-side electrode 102 in such a manner as to project beyond the sensing-side electrode 101, thereby preventing the electric line of force from the sensor plates 101 and 102 from extending toward the ground surface. However, this arrangement entails a drawback in that a part of the electric line of force is inevitably captured by the ground-side electrode 102, thereby lowering the sensitivity. The present invention is proposed in this connection.

Figure 30:
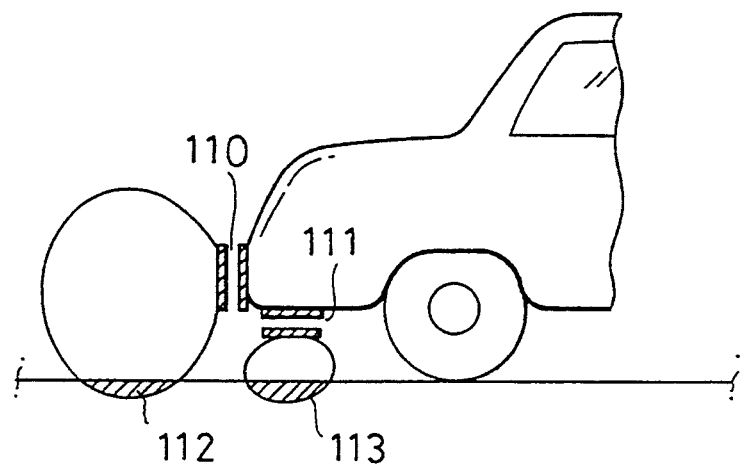
FIG. 30 is a view showing an example of the arrangement of the sensor plates of the electronic car bumper in accordance with the present invention.
Figure 31:
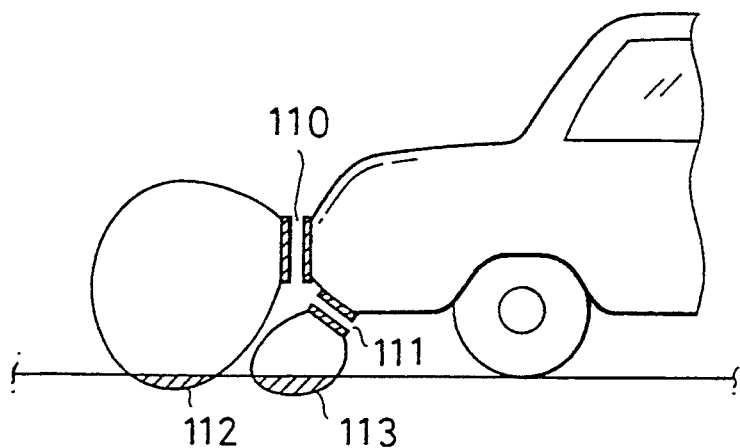
FIG. 31 is a view showing another example of the arrangement of the sensor plates of the electronic car bumper in accordance with the present invention.

FIGS. 30 and 31 show the arrangement of sensor plates of the electronic car bumper in accordance with the present invention. In FIG. 30, sub-sensor plates 111 are directed vertically downward, whereas in FIG. 31, the sub-sensor plates 111 are directed obliquely downward so that the part of the ground is directed obliquely downward so that the part of the ground surface to be sensed thereby is closer to the part of the ground surface to be sensed by main sensor plates 110. Although the sub-sensor plates 111 are directed vertically or obliquely downward in FIGS. 30 and 31, they may be directed vertically or obliquely upward for the sensor plates 110. In order to detect an obstacle employing these sensor plates, a signal processing is performed by a circuit shown in FIG. 32.

Figure 32:
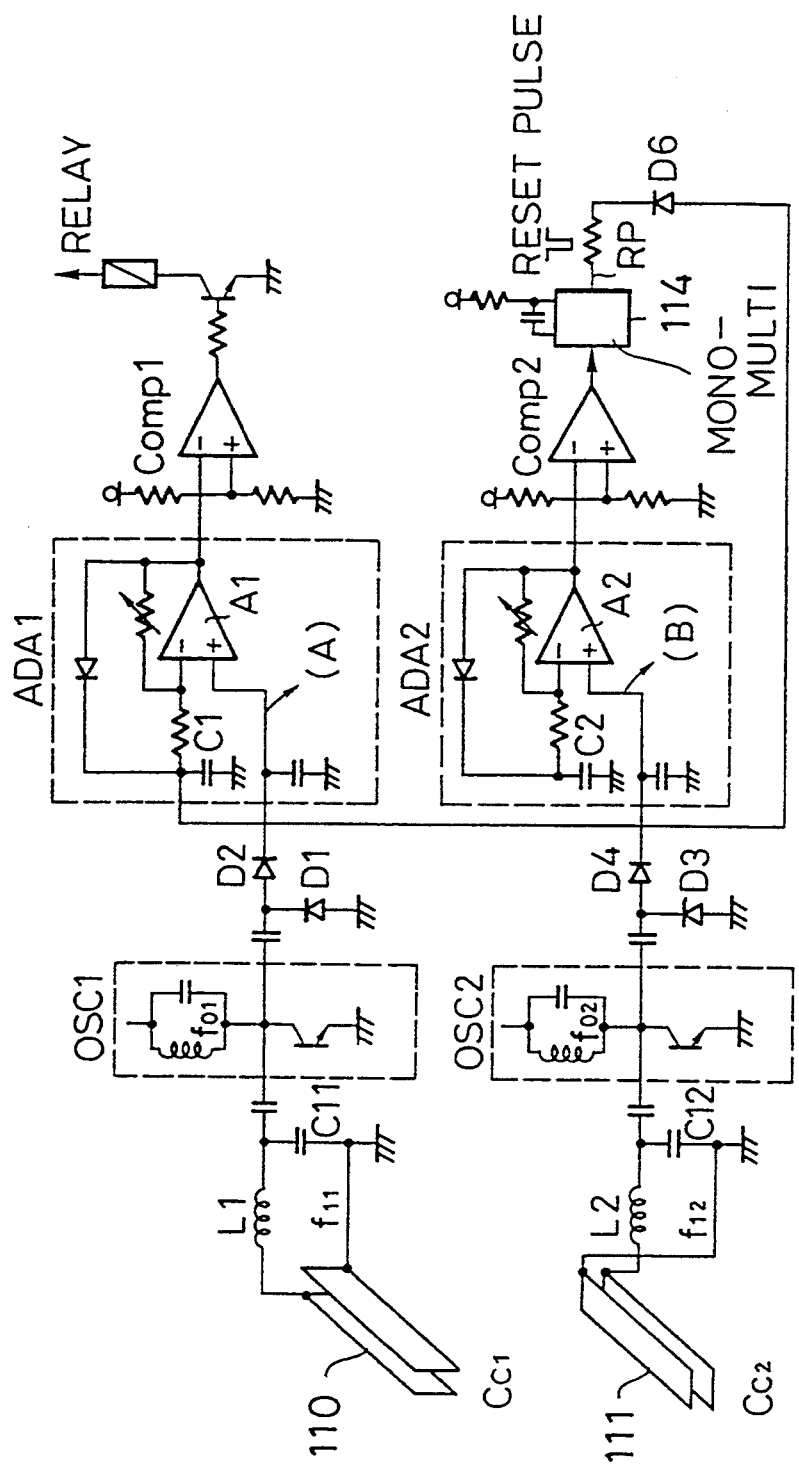
FIG. 32 is a circuit diagram for illustrating the operation of the present invention.

In FIG. 32, a high-frequency oscillation $f_{01}$ from an oscillation circuit OSC1 is supplied to the main sensor plates 110, and the main sensor plates 110 are used in a state where a frequency $f_{11}$ of a resonance circuit including a capacitance $C_c1$ of the main sensor plates 110, a divide capacitor C11 and a loading coil L1 approximates the frequency $f_{01}$. The resultant output is converted into a DC output by detectors (diodes) D1 and D2 and, thereafter, amplified by an automatic resetting-type DC amplifier ADA1. The amplified output is binarized by a comparator Comp1 so that a switch is formed. In this embodiment, a relay is driven by the output of the comparator Comp1 through a transistor. The sub-sensor plates ill are used in a similar skate where the capacitance $C_c2$ of the sub-sensor plates 111, a divide capacitor C12 and a loading coil L2 are already adjusted in such a manner that the resonance frequency $f_{12}$ approximates the frequency $f_{02}$ of an oscillation circuit OSC2. The resultant output is detected by detectors (diodes) D3 and D4 and, thereafter, amplified by an automatic resetting-type DC amplifier ADA2. The amplified output is binarized by a comparator Comp2, and then input to a monostable multi-vibrator 114. A reset pulse RP output from the monostable multi-vibrator 114 is input to the amplifier ADA1 through a resistor and a diode D6.

Let us assume, here, that the sub-sensor plates 111 have detected unevenness of a part of the ground surface. In this case, the output of the oscillation circuit OSC2 drops. The drop results in the comparator Comp2 generating a positive output, and the monostable multi-vibrator 114 generating a negative pulse, these circuits constituting a reset circuit for discharging a capacitor C1 of the resetting-type DC amplifier ADA1. To illustrate with reference to the time chart shown in FIGS. 33A to 33D, if the undulation of the ground surface has changed in the manner shown in FIG. 33A, the output of the amplifier ADA1 should have dropped, as indicated by the two-dot-chain line in FIG. 33B. In fact, however, since the output of the amplifier ADA2 for the sub-sensor plates 111 also drops as shown in FIG. 33C, the comparator Comp2 and the monostable multi-vibrator 114 generate a reset pulse RP, such as that shown in FIG. 33D, thereby resetting the amplifier ADA1. Accordingly, as indicated by the solid line in FIG. 33B, a signal which does not indicate the sensing of a change in the ground surface, is generated, and the relay is not actuated.

Figure 34:
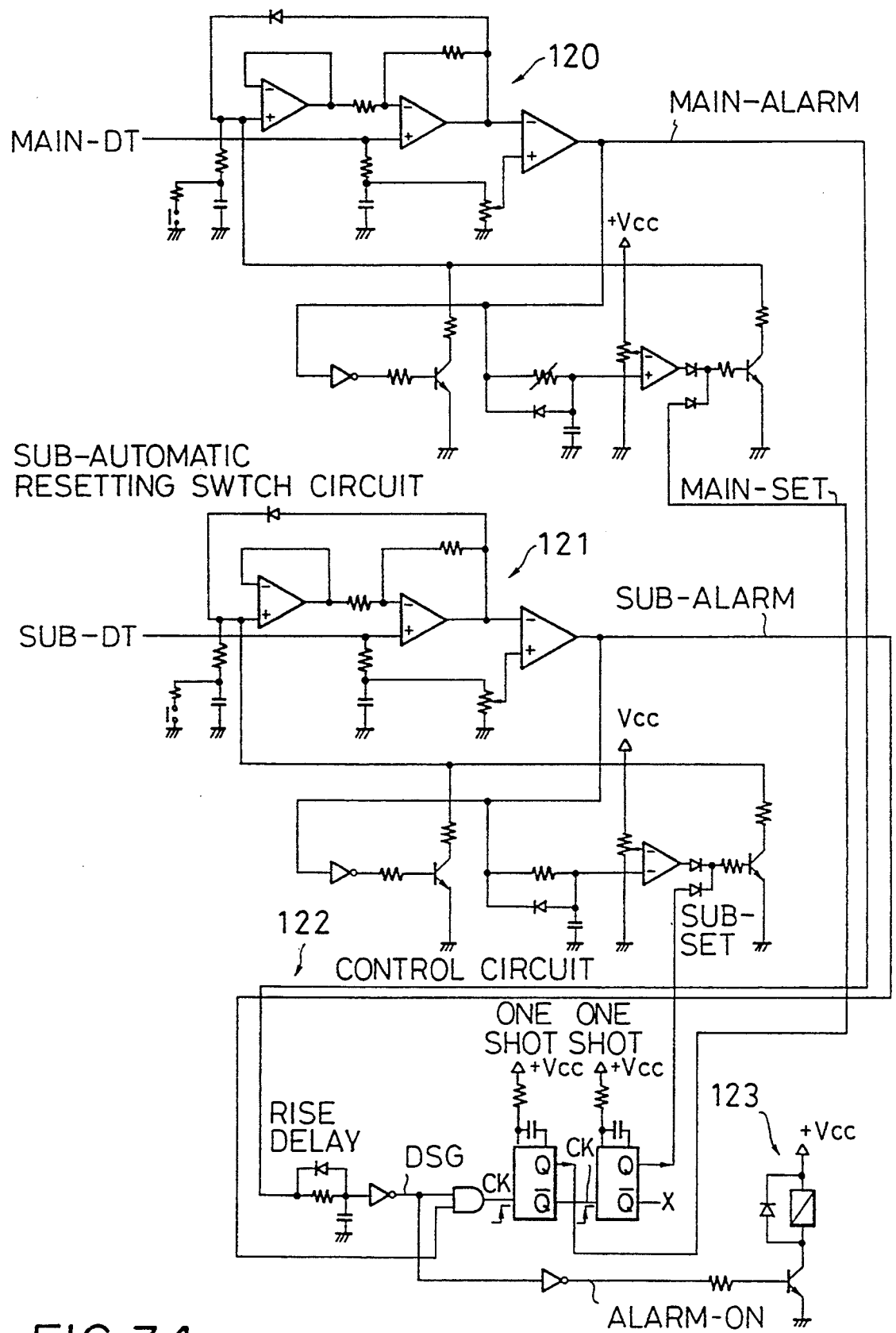
FIG. 34 is a circuit diagram showing another embodiment of the present invention.

The above-description, chosen for the purpose of simplifying the illustration, concerns the case where the two sensor plates 110 and 111 simultaneously sense the same part of the ground surface. In actuality, since there is a time difference, the circuit shown in FIG. 34 is used to perform a signal processing. In the drawing, an input MAIN-DT and an input SUB-DT respectively represent-the detection output (A) of the main sensor plates 110 and the detection output (B) of the sub-sensor plates 111, both shown in FIG. 32. A signal MAIN-ALARM and a signal. SUB-ALARM respectively output from a main-automatic resetting switch circuit 120 and a sub-automatic resetting switch circuit 121 are processed and subjected to time adjustment by a control circuit 122 so that a relay 123 for alarming can be actuated. The operation of the circuit shown in FIG. 34 will be illustrated with reference to the time chart shown in FIGS. 35A to 35F.

When the signal MAIN-ALARM alone has been generated from the switch circuit 120 as shown in FIG. 35A, a signal ALARM-ON is issued after the passage of a rise delay period of time from the generation by inverting a rise delay output DSG as shown in FIGS. 35B and 35F. Even if a signal SUB-ALARM is generated from the switch circuit 121 during the issuance of the signal ALARM-ON as shown in FIGS. 35C and 35F, the signal SUB-ALARM is disregarded, resulting in that the automatic resetting switch circuits 120 and 121 are not set. If the signal MAIN-ALARM is turned off within the rise delay period of time after the generation, no signal ALARM-ON is issued as shown in FIGS. 35A and 35F. The above arrangement makes it possible to avoid erroneous alarming due to a noise or the like in the main circuit.

When the signal SUB-ALARM has been generated while the signal MAIN-ALARM is off, or when it has not completely passed after the generation of the signals MAIN-ALARM, MAIN-SET and SUB-SET are generated, resulting in that the automatic resetting switch circuits 120 and 121 are set. The level(s) of the currently input signal (s) are stored and, simultaneously, the signal MAIN-ALARM and the signal SUB-ALARM currently being generated are terminated. The signals MAIN-SET and SUB-SET are such that, since they are generated on the basis of the signal SUB-ALARM (the automatic resetting switch circuit 121 detects a signal indicating the current position of the car), the signal MAIN-SET is output first as shown in FIG. 35D, and when this signal is terminated, the signal SUB-SET is output as shown in FIG. 35E.

As has been described above, in the electronic car bumper according to the present invention, the sub-sensor plates detects and removes ground surface noises generated in the main sensor plates for detecting an obstacle such as a person. Therefore, it is possible to improve the sensitivity without involving the risk of malfunction even when the bumper mounting position is low to the ground.

It should be understood that many modifications and adaptations of the invention will become apparent to those skilled in the art and it is intended to encompass such obvious modifications and changes in the scope of the claims appended hereto.

What is claimed is:

1. An electronic car bumper comprising:
   a plurality of sensors, provided in a car bumper, each including sensor plates, a first loading coil coupled to one of said sensor plates, and a first divided capacitor coupled to said loading coil;
   a reference resonance circuit including a reference capacitor, a second loading coil coupled to said reference capacitor and a second divided capacitor coupled to said second loading coil;

an oscillator which selectively drives any one of said sensors and said reference resonance circuit through a switch device;

a detector for detecting an output of said oscillating portion;

a discriminator for discriminating an output of said detector and providing a corresponding discriminating signal as a first output associated with said sensors and a second output associated with said reference resonance circuit;

a synchronous means for switching said switch device and said first and second outputs of said discriminator in synchronization;

a direct current amplifier for amplifying the first output of said discriminator associated with said sensors, in which an output of the amplifier is adjusted to a point at zero as a reference voltage according to the second output of said discriminator portion associated with said reference resonance circuit; and a comparator which compares an output of said direct current amplifier with a threshold reference which is adjusted according to said reference voltage.

2. An electronic car bumper as claimed in claim 1, further including a smoothing circuit for smoothing the output from said detector corresponding to each of said sensors.

3. An electronic car bumper as claimed in claim 2, further including a voltage follower connected in front of said smoothing circuit.

4. An electronic car bumper as claimed in claim 3, wherein two of said sensors are mounted at a front bumper and two of said sensors are mounted at a rear bumper.

5. An electronic car bumper comprising:

a plurality of sensors, located in a car bumper, each comprising sensor plates and a first loading coil connected to one of said sensor plates;

a reference resonance circuit comprising a reference capacitor and a second loading coil connected to said reference capacitor;

a plurality of oscillators respectively connected to said plurality of sensors and said reference resonance circuit;

a plurality of first switches respectively connecting said plurality of oscillators to a power supply;

a discriminating portion for discriminating and gating outputs of said plurality of oscillators corresponding to said plurality of sensors and said reference resonance circuit through a plurality of second switches;

a synchronous means for switching said first and second switches in synchronization; and comparators which are connected to said plurality of second switches and which compare outputs corresponding to said plurality of sensors with a reference voltage corresponding to an output from said reference resonance circuit.

6. An electronic car bumper as claimed in claim 5, further including detectors which detect the respective outputs of said oscillators.

7. An electronic car bumper as claimed in claim 6, further including direct current amplifiers which amplify outputs from said detectors corresponding to said sensors.

8. An electronic car bumper employing a high-frequency proximity switch including sensor plates comprising:

parallel first and second plate electrodes which confront each other and are mounted in a bumper of a car, said first plate electrode confronting an object to be detected and including at least spaced apart first and second sub-plate electrodes each being parallel to and confronting said second plate electrode;

an oscillation circuit and a tuning circuit respectively connected to said first and second sub-plate electrodes;

a detector which detects a high-frequency output generated from said tuning circuit caused by a high-frequency current flowing in said oscillation circuit; and a means for detecting an obstacle according to a change of the high-frequency output.

9. An electronic car bumper as claimed in claim 8, further including:

a reference circuit having a reference capacitance;

first switches connecting said second sub-plate electrode and said reference circuit to said tuning circuit;

direct current amplifiers adjusting the output of said reference circuit to a reference voltage set at a point zero and inputting outputs corresponding to said second sub-plate electrodes from said detector through second switches;

comparators for comparing respective outputs from said direct current amplifiers with the reference voltage so as to detect an obstacle; and a synchronous means for switching said first and second switches in synchronization.

10. An electronic car bumper as claimed in claim 9, further comprising a voltage follower connected between said detector and said second switches and a smoothing circuit connected at output portions of said second switches.

11. An electronic car bumper as claimed in claim 10, wherein said first and second switches are analog switches and said synchronous means is a ring counter.

12. An electronic car bumper as claimed in claim 8, wherein said second sub-plate electrode connected to said tuning circuit is formed by at least two spaced apart plate electrodes.

13. An electronic car bumper employing a high-frequency proximity switch, which comprises:

a main sensor portion having sensing plates composed of parallel plate electrodes directed toward an object sensing area; and a sub-sensor portion having sensing plates composed of parallel electrodes directed either vertically downward or obliquely downward relative to the object sensing area;

wherein said main sensor portion and said sub-sensor portion are arranged such that a part of a ground surface within a sensitivity distribution range of said main sensor portion is included within a sensitivity distribution range of said sub-sensor portion after movement of said electronic car bumper along the ground surface so as to remove, from a detection signal obtained from an oscillation output of said main sensor portion, noise caused by unevenness of the ground surface and obtained from an oscillation output of said sub-sensor portion.

14. An electronic car bumper employing a high-frequency proximity switch, which comprises:
- a main sensor portion having sensing plates composed of parallel electrodes directed toward an object sensing area and being mounted in a car bumper;
- a sub-sensor portion having sensing plates composed of parallel electrodes directed either vertically downward or obliquely downward relative to the object sensing area and being mounted in the car bumper;
- a first oscillator connected to said main sensor portion;
- a second oscillator connected to said sub-sensor portion;
- a first detector for detecting an output of said first oscillator;
- a second detector for detecting an output of said second oscillator;
- a first automatic resetting-type amplifier for amplifying an output of said first detector;
- a second automatic resetting-type amplifier for amplifying an output of said second detector;
- a first comparator outputting a detection signal by comparing the output from said first automatic resetting-type amplifier with a first reference signal; and
- a second comparator outputting a reset pulse by comparing the output from said second automatic resetting-type amplifier with a second reference signal so as to input the reset pulse to said first automatic resetting-type amplifier.

* * * * *